US006436601B1

(12) United States Patent
Seth et al.

(10) Patent No.: US 6,436,601 B1
(45) Date of Patent: Aug. 20, 2002

(54) THERMALLY SENSITIVE COATING COMPOSITIONS CONTAINING MIXED DIAZO NOVOLAKS USEFUL FOR LITHOGRAPHIC ELEMENTS

(75) Inventors: Prakash Seth, Jackson, TN (US); Charles S. Cusumano, Boca Raton, FL (US)

(73) Assignee: Citiplate, Inc., Roslyn Heights, NY (US)

( * ) Notice: Subject to any disclaimer, the term of this patent is extended or adjusted under 35 U.S.C. 154(b) by 0 days.

(21) Appl. No.: 09/888,685

(22) Filed: Jun. 25, 2001

(51) Int. Cl.[7] .................................... G03F 7/023

(52) U.S. Cl. ..................... 430/190; 430/191; 430/192; 430/193; 430/326

(58) Field of Search ............................ 430/190, 191, 430/192, 193, 326

(56) References Cited

U.S. PATENT DOCUMENTS

| | | | | | |
|---|---|---|---|---|---|
| 4,316,949 | A | | 2/1982 | Petrellis et al. | 430/159 |
| 5,578,416 | A | | 11/1996 | Tutt | 430/270.18 |
| 5,663,037 | A | | 9/1997 | Haley et al. | 430/178.1 |
| 5,705,322 | A | | 1/1998 | West et al. | 430/325 |
| 5,858,626 | A | | 1/1999 | Sheriff et al. | 430/326 |
| 5,919,601 | A | | 7/1999 | Nguyen et al. | 430/278.1 |
| 6,060,217 | A | * | 5/2000 | Nguyen et al. | 430/302 |
| 6,060,222 | A | | 5/2000 | West et al. | 430/326 |
| 6,063,544 | A | | 5/2000 | Sheriff et al. | 430/271.1 |
| 6,117,610 | A | * | 9/2000 | Sheriff et al. | 430/165 |
| 6,232,031 | B1 | * | 5/2001 | Gracia et al. | 430/165 |
| 6,376,150 | B1 | * | 4/2002 | Bolli et al. | 430/165 |

* cited by examiner

*Primary Examiner*—John S. Chu
(74) *Attorney, Agent, or Firm*—Perman & Green, LLP

(57) ABSTRACT

An infrared imaging composition comprises a mixture of at least two novolak resins esterified with from about 0.1 to 50 mole % of a 2-diazo-1-naphthol-4 or 5-sulfonic acid or derivative thereof, wherein the degree of esterification of one novolak differs from the degree of esterification of the other by at least about 3 mole %, further mixed with an infrared radiation absorbing compound. When applied to a proper support and processed, the composition is useful as an offset lithographics printing plate, color proofing film or image resist.

17 Claims, No Drawings

THERMALLY SENSITIVE COATING COMPOSITIONS CONTAINING MIXED DIAZO NOVOLAKS USEFUL FOR LITHOGRAPHIC ELEMENTS

BACKGROUND OF THE INVENTION

1. Field of the Invention

The invention relates to thermally sensitive coating compositions useful for the preparation of lithographic printing plates, color proofing films and the like.

2. Description of Related Art

The art of lithographic printing is based upon the immiscibility of oil and water, wherein the oily material or ink is preferentially retained by the image area and the water or fountain solution is preferentially retained by the non-image area. When a suitably prepared surface is moistened with water and an ink is then applied, the background or non-image area retains the water and repels the ink while the image area accepts the ink and repels the water. The ink on the image area is then transferred to the surface of a material upon which the image is to be reproduced, such as paper, cloth and the like. Commonly the ink is transferred to an intermediate material called the blanket which in turn transfers the ink to the surface of the material upon which the image is to be reproduced.

A very widely used type of lithographic printing plate has a light-sensitive coating applied to an aluminum base support. The coating may respond to light by having the portion which is exposed become soluble so that it is removed in the developing process. Such a plate is referred to as positive-working. Conversely, when that portion of the coating which is exposed becomes hardened, the plate is referred to as negative-working. In both instances the image area remaining is ink-receptive or oleophilic and the non-image area or background is water-receptive or hydrophilic. The differentiation between image and non-image areas is made in the exposure process where a film is applied to the plate with a vacuum to insure good contact. The plate is then exposed to a light source, a portion of which is composed of UV radiation. In the instance where a positive plate is used, the area on the film that corresponds to the image on the plate is opaque so that no light will strike the plate, whereas the area on the film that corresponds to the non-image area is clear and permits the transmission of light to the coating which then becomes more soluble and is removed. In the case of a negative plate the converse is true. The area on the film corresponding to the image area is clear while the non-image area is opaque. The coating under the clear area of film is hardened by the action of light while the area not struck by light is removed. The light-hardened surface of a negative plate is therefore oleophilic and will accept ink while the non-image area which has had the coating removed through he action of a developer is desensitized and is therefore hydrophilic.

Direct digital imaging of offset printing plates has become increasingly important in the printing industry. Advances in solid-state laser technology have made medium to high-powered diode lasers attractive energy sources for platesetters, particularly lasers emitting energy in the near infrared (800–850 mm) regions. The use of controlled laser exposure obviates the need to use a film or mask when making image exposures, thereby facilitating a platemaking operation.

There are a number of United States patents relating to imaging compositions which are sensitive to infrared energy and which contain one or a mixture of phenolic resins and at least one infra-red absorbing dye or pigment. Positive acting plates based on a mixture of a novolak or resole or polyhydroxy-styrene resin and an IR absorbing dye are disclosed in U.S. Pat. No. 6,063,544. Printing plates based on a mixture of a novolak resin, a resole resin, an infrared absorbing dye or pigment and a latent Bronstead acid are disclosed in U.S. Pat. Nos. 5,372,907, 5,372,915, 5,466,577, and 5,491,046. Exposure of these plates to infrared radiation decomposes the latent Bronstead acid to yield species which will serve to crosslink the resole and novolak resins, thereby hardening the mixture in the exposed areas. Further heating of the exposed plate tends to further harden the exposed coating which becomes insoluble in aqueous alkaline developer, while the non-exposed areas remain soluble in developer solution.

In addition, U.S. Pat. Nos. 5,705,322 and 5,858,626 disclose laser-imagable photosensitive elements based on one or a mixture of a phenolic resin and an o-diazonaphthoquinone derivative or the esterification product thereof with a phenolic resin and an infrared absorbing compound. Elements of the '322 patent are negative working and require image exposure first followed by floodlight exposure prior to development. Elements of the '626 patent are positive working and require no floodlighting prior to or after development.

One of the problems associated with these and similar systems is that there is often insufficient integrity of the image areas remaining after development of the printing plate to effectively perform the printing process over long printing runs, resulting in print images having less than desired resolution and print quality.

SUMMARY OF THE INVENTION

The invention provides a radiation sensitive composition useful for the preparation of an imaging layer on a support comprising a mixture of:

a) a first novolak resin which is the esterification product of a novolak resin and of a diazo compound selected from the group consisting of 2-diazo-1-naphthol-4-sulfonic acid, 2-diazo-1-naphthol-5-sulfonic acid and ester-reactive derivatives thereof, said esterification product containing from about 0.5 to 50 mole % of said diazo compound;

b) a second novolak resin which is the esterification product of a novolak resin and a diazo compound selected from the group consisting of 2-diazo-1-naphthol-4-sulfonic acid, 2-diazo-1-naphthol-5-sulfonic acid and ester-reactive derivative thereof, said esterification product containing from about 0.5% to 50 mole % of said diazo compound, said second esterification product having a content of said diazo compound which differs by at least about 3 mole % from the diazo compound content of said first esterification product; and c) an infrared radiation absorbing compound.

The invention also provides a process for preparing an image comprising i) providing an imaging layer coated on a support material, and imaging layer comprising the esterification product mixture of (a), (b) and (c) above;

ii) imagewise exposing said imaging layer to energy emitting an infrared laser beam of sufficient energy to at least partially decompose the diazo compounds present in said esterification products; and iii) contacting said imaging layer with a developer material wherein the exposed areas of said imaging layer are selectively removed from said support.

The radiation sensitive compositions of this invention may be applied to various substrates to form photosensitive elements. If applied to a textured and anodized aluminum plate, the coated plate may be used as a planographic (lithographic) printing plate capable of printing thousands of high quality, high resolution images. If the composition is applied to a transparent film support, e.g., a polyester film, it may be advantageously used as a film for color proofing. The composition may also be used as a photoresist for making printed circuits.

DETAILED DESCRIPTION OF THE INVENTION

The novolak resins used in the present invention are the condensation product of a phenolic or an aliphatic substituted hydroxy aromatic compound and an aldehyde. Preferred novolak resins include a condensation product of phenol, o-chlorophenol, o, m or p-cresol, p-hydroxy benzoic acid, 2-naphthol or other hydroxy aromatic monomers with an aldehyde such as formaldehyde, acetaldehyde, fural, benzaldehyde, or any other aliphatic or aromatic aldehyde. This polymer is preferred to have a molecular weight in the range of 1000 to 70,000, more preferably in the range of 2,000 to 40,000, and most preferably in the range of 3,000 to 12,000. Novolaks are common materials readily available commercially. Due to how they are prepared, there is a variability that will exist from lot-to-lot that makes the coating vary too much to be considered a reliable product. High and low molecular weight polymers are advantageously blended to insure a constant product. The intrinsic viscosity is measured using a Pensky Marten capillary method. 10.0% (w/w) is dissolved in methylethyl ketone. A #300 capillary tube is immersed in a water bath maintained at 25° C. Using the constant for the tube times the seconds measured, the viscosity in centistokes is obtained. The preferred range is 2–50 centistokes. More preferred is 3–35 centistokes. Most preferred is 4–20 centistokes. By measuring the viscosity of two novolaks having different molecular weights, variations can be obviated by changing the ratios to achieve the target viscosity.

The compositions of the invention are rendered photothermally sensitive by employing a mixture of at least two novolaks as described above which have been reacted with different molar ratios of a diazo compound selected from the group consisting of 2-diazo-1-naphthol4-sulfonic acid, 2-diazo-1-naphthol-5-sulfonic acid and ester-reactive derivatives thereof such as the sulfonyl chloride or the sulfonic acid/lower alkyl ester. Thus, a first novolak resin is esterified with a diazo compound to provide an esterification product containing from about 0.5 to 50 mole % of said diazo compound and a second novolak (which may be the same or different from the first novolak) is esterified with a diazo compound (which may be the same or different from the first diazo compound) to provide an esterification product containing from about 0.5 to 50 mole % of said diazo compound, with the proviso that the second esterification product has a content of diazo compound which differs by at least about 3 mole % from the diazo compound content of the first esterification product. More preferably, the esterification products contain about 1 to 35 mole %, most preferably from about 5 to 25 mole % of said diazo compound, and the differentiation in diazo compound content of the two esterified novolaks is at least 4 mole %, most preferably from about 5 to 15 mole %.

It has been found that mixtures of at least two esterified diazo novolaks having different diazo contents is necessary for the production of printing plates which have both good image resolution and provide a long press life. Plates prepared using a single esterified diazo novolak are unsatisfactory as shown in the examples. The esterified diazo novolaks are blended such that the content of the second esterification product ranges from about 10 to 90 wt %, more preferably 35 to 65 wt % of the total content of the first and second esterification products.

The composition may also contain one or more additional esterified diazo novolaks having a different diazo content from the first two, as well as up to about 35 wt % of an unreacted novolak.

The esterified novolaks may be prepared by conventional esterification reactions between the hydroxyl-group-containing novolak and the sulfonic acid or derivative by reactions of the type disclosed in U.S. Pat. Nos. 4,308,368 and 5,145,763 as well as GB 1546633. The esterified novolaks are also commercially available from Diversitec Corp, Fort Collins, Colo. under the trade designations PDS-5, PDS-10, PDS-15, etc.

The infrared absorber used in the invention is a compound which will absorb radiation in the IR range of about 750 to 875 nm, more preferably in the range of about 800 to 850 nm and most preferably at about 830 nm. Classes of materials which are useful include but are not limited to squarlium, cyanide, polymethine, and pyrilium dyes or pigments, although dyes are preferred. Preferred dyes include, but are not limited to pyridyl, quinolinyl, benzoxazolyl, thiazolyl, benzothiazolyl, oxazolyl and selenazolyl. The optimal dye must be selected with care so that the absorption (lambda maximum) is closely matched with the output wavelength of the laser used for exposure. Dyes advantageously will enhance the differentiation between the image and non-image areas created when the laser images the medium being employed.

The coating composition also preferably contains a third component which is polymeric dissolution inhibitor. The function of this material is to inhibit dissolution or erosion of the image areas during development while not interfering with the other performance characteristics of the coatings such as to allow facile processing of the non-image areas of a plate. Suitable polymers are those containing acids or acid derivative groups such as copolymers of styrene with maleic acid, maleic anhydride or maleic acid half ester; cellulose acetate butyrate; cellulose acetate propionate; polyvinyl acetate; maleic acid or maleic anhydride derivates of polyvinyl methyl ether, and mixtures thereof.

The total content of the mixed esterified novolaks present in the composition may range from about 60 to 99 wt %, more preferably about 70 to 98 wt % and most preferably about 80 to 97 wt %. The content of the infrared absorbent material may range from about 0.1 to 15 wt %, more preferably about 0.5 to 10 wt % and most preferably from about 1.0 to 7 wt %. The content of the dissolution inhibitor, when present, may range from about 0.1 to 30 wt %, more preferably about 0.5 to 20 wt % and most preferably about 1 to 10 wt %. All the above weights are on a dry weight basis.

The composition may also include a colorant (indicator dye) which aids in visual identification of image areas after development of a printing plate. The composition may also contain any of the known cyan, yellow or magenta dyes or pigments for use in color proofing applications. Preferred colorants include Victoria Blue, Neptune Blue, Basic Blue, methylene blue, crystal violet, Disperse Red 1, 4, or 13, and methyl violet.

The composition may also include other additives normally used in photothermal sensitive compositions such as surfactants, acid stabilizers and wetting agents.

The composition is coated onto a support by first forming a solution in suitable organic solvent and applying the solution to a substrate support such as an anodized aluminum plate or polyester film. Coating methods include conventional roll, gravure, spin or hopper coating processes. Suitable coating solvents include, but are not restricted to: 1-methoxy-2-ethanol, 1-methoxy-2-propanol, acetone, methyl ethyl ketone, diisobutyl ketone, methyl isobutyl ketone, n-propanol, isopropanol, tetrahydrofuran, butyrolactone, methyl lactate and mixtures thereof.

The coating components are dissolved in the desired solvent system. The coating solution is applied to the substrate of choice. The coating is applied so as to have a dry coating weight in the range of about 0.8 g/M$^2$ to about 3.5 g/M$^2$. More preferred is from about 1.1 g/M$^2$ to about 2.7 g/M$^2$, and most preferred is from about 1.3 g/M$^2$ to about 2.4 g/M$^2$. The coating is dried under conditions that will effectively remove all solvent, but not so aggressive as to cause any significant degradation of the esterified diazo novolak components of the composition.

When used as a printing plate, the composition is primarily sensitive to energy in the infrared region. There is also sensitivity in the ultraviolet region of the spectrum. This dual sensitivity can afford the advantage of being imaged with a laser imagesetter or with conventional contact exposure.

A plate is preferably placed on an imagesetter for imaging. Image setters may output at a variety of wavelengths in the UV, visible and infrared portions of the electromagnetic spectrum. Presently there is one wavelength predominantly used for infrared imaging. An array of laser diodes emitting at 830 nm is commercially available.

The total power available can vary from 1 to 14 watts and is applied for an amount of time to yield available energy for imaging of up to 250 mJ./cm$^2$. The preferred energy ranges from 130 to 210 mJ./cm$^2$. A suitable imaging device is manufactured and sold by Creo-Scitex, Vancouver, Canada. Digitized information is used to modulate the output from the laser. The energy is directed to the plate surface where an energy transfer mechanism occurs. The absorbing dye absorb the energy and emits the energy as intense localized heat. The heat in turn causes a degradation of the diazo present in the esterified novolaks and the development of indene carboxylic acids which render the image-struck areas more soluble in aqueous alkaline developers. Thus the imaged areas are removed during development; the non-imaged areas remain. Unlike some analogous systems, there is no pre-heating step after imaging of the plate and prior to development.

The coating compositions described are developed using a developer composition, which is completely aqueous and has a high pH. Developers typically used for positive plates are most useful. The developer takes advantage of the differentiation created with the exposure to remove the exposed coating and permit the non-exposed image to remain. At this point the image is capable of performance on press.

The following examples are illustrative of the invention.

EXAMPLE 1

A coating solution was prepared by dissolving 14.12 gr. of capped (esterified) novolak PDS-5 (a product produced and sold by Diversitec Corp., Fort Collins, Colo.) which has 5 mole percent of the novolak esterified with 2-diazo-1-naphthol-5-sulfonyl chloride, 0.34 gr of cellulose acetate butyrate (CAB 321–0.1 sold by Eastman Chemicals), 0.46 gr. of laser dye 830AT (sold by ADS, Montreal, Canada), and 0.08 gr of Neptune Blue were mixed with 129.36 gr of 1-methoxy-2-propanol and 55.60 gr of methyl ethyl ketone. An aluminum substrate that had been degreased, mechanically grained, anodized and made hydrophilic with a treatment of polyvinyl phosphoric acid, as is well known to one skilled in the art, was coated with the above composition. The dry coating weight was 2.3 g/m$^2$. When properly dried, the plate was placed in a Creo-Scitex Trendsetter imagesetter. Imaging was done in the "write-the-background" mode using 175 mJ/cm$^2$ of energy at 830 nm. The plate was developed through a processing machine, which was charged with conventional positive developer. The developed plate was observed to have an image that had borderline acceptability. Based upon a resolution target, the microlines were 15/20 and the halftone dot resolution was 10-96. The developer appeared to have attacked the highlight areas of the image. Under accelerated wear press conditions the plate produced 3,000 impressions before it was considered to have degraded significantly from the image quality at start-up. In general the image integrity was too weak.

EXAMPLE 2

In like manner as described in Example 1, a plate was similarly prepared except that the PDS-5 was replaced with PDS-10. Here, 10 mole percent of the novolak was esterified with 2-diazo-1-naphthol-5-sulfonyl chloride. An aluminum plate, heretofore described, was coated and imaged using 175 mJ/cm$^2$. The plate was developed through a processing machine, which was charged with conventional positive developer. The development was observed to be slow. The plate had to be processed a second time to fully desensitize the background of the plate. The plate had microline resolution of 10/12 and halftone resolution of 5-96. When run on press only 5,500 acceptable impressions were obtained before considering the quality commercially unacceptable. Although improved over the PDS-5 performance, the PDS-10 was difficult to develop, while still having poor development.

EXAMPLE 3

In like manner as described in example 1, a plate was similarly prepared except that the PDS-5 was replaced with PDS-15. Here, 15 mole percent of the novolak was esterified with 2-diazo-1-naphthol-5-sulfonyl chloride. An aluminum plate heretofore described was coated and background using 175 mJ/cm$^2$. The plate was developed through a processing machine, which was charged with conventional positive developer. The image was not adequately desensitized through the processor. Even when processed a second time through the processor, the background was not adequately desensitized. Consequently, the plate was not able to be run on press.

EXAMPLE 4

In like manner as described in example 1, a plate was similarly prepared except that the total amount of PDS-5 was replaced with a 50:50 blend of PDS-5 and PDS-10. An aluminum plate heretofore described was coated and imaged using 175 mJ/cm$^2$. The plate was developed through a processing machine, which was charged with conventional positive developer. Upon inspection, the plate was observed to have a microline resolution of 2-98 and a half tone resolution of 2-98. When run on press 12,500 acceptable impressions were obtained before considering the quality commercially unacceptable. This test clearly demonstrate that a blend of capped novolak resins is more advantageous than single capped novolak resins.

EXAMPLE 5

In like manner as described in example 1, a plate was similarly prepared except that the total amount of PDS-5 was replaced with a 50:50 blend of PDS-5 and PDS-15. An aluminum plate heretofore described was coated and imaged using 175 mJ/cm$^2$. The plate was developed through a processing machine, which was charged with conventional positive developer. Upon inspection the plate was observed to have a microline resolution of 2-98 and a half tone resolution of 2-98. When run on press 12,500 acceptable impressions were obtained before considering the quality commercially unacceptable. As an average, this blend of the 5 and 15 mole percent capped novolaks is equal to 10%. In comparison to the results from example 2, the results are completely different. The blend of two different capped novolaks is functionally different than the equivalent single capped novolak.

What is claimed is:

1. A radiation sensitive composition useful for the preparation of an imaging layer on a support comprising a mixture of:

a) a first novolak resin which is the esterification product of a novolak resin and of a diazo compound selected from the group consisting of 2-diazo-1-naphthol-4-sulfonic acid, 2-diazo-1-naphthol-5-sulfonic acid and ester-reactive derivatives thereof, said esterification product containing from about 0.5 to 50 mole % of said diazo compound;

b) a second novolak resin which is the esterification product of a novolak resin and a diazo compound selected from the group consisting of 2-diazo-1-naphthol-4-sulfonic acid, 2-diazo-1-naphthol-5-sulfonic acid, and ester-reactive derivatives thereof, said esterification product containing from about 0.5 to 50 mole % of said diazo compound, said second esterification product having a content of said diazo compound which differs by at least about 3 mole % from the diazo compound content of said first esterification product; and c) an infrared radiation absorbing compound.

2. The composition of claim 1 further containing:

d) a polymeric dissolution inhibitor.

3. The composition of claim 1 wherein said first and second esterification products contain about 1 to 35 mole % of said diazo compound.

4. The composition of claim 3 wherein the content of diazo compound in each of said first and second esterification products differs by at least 4 mole %.

5. The composition of claim 4 wherein said first and second esterification products contains about 5 to 25 mole % of said diazo compound.

6. The composition of claim 1 wherein said diazo compound is selected from the group consisting of 2 diazo-1-naphthol-4-sulfonyl chloride, 2-diazo-1-naphthol5-sulfonyl chloride and mixtures thereof.

7. The composition of claim 1 containing from about 10 to 90 wt % of said second esterification product, based on the total content of said first and second esterification products.

8. The composition of claim 7 containing about 35 to 65 wt % of said second esterification product.

9. The composition of claim 4 wherein the content of diazo compounds in each of said first and second esterification products differs by about 5 to 15 mole %.

10. The composition of claim 1 wherein mixed components (a) and (b) are present in the composition at a level of from about 60 to 99 wt % and component (c) is present at a level of from about 0.1 to about 15 wt %.

11. The composition of claim 10 wherein said infrared absorbing compound is a dye absorbing in the range of about 750 to 875 nm.

12. The composition of claim 10 further containing:

(d) a polymeric dissolution inhibitor present in said composition at a level of about 0.1 to 30 wt %.

13. The composition of claim 12 wherein said polymeric dissolution inhibitor is selected from the group consisting of copolymers of styrene with maleic acid, maleic anhydride or maleic acid half ester, cellulose acetate butyrate, cellulose acetate propionate, polyvinylacetate, maleic acid or maleic anhydride derivatives of polyvinyl methyl ether and mixtures thereof.

14. The composition of claim 1 wherein said support comprises a printing plate.

15. The composition of claim 1 applied to a printing plate.

16. The composition of claim 15 where said printing plate is an aluminum sheet.

17. A process for preparing an image comprising i) providing an imaging layer coated on a support material, said imaging layer comprising the mixture of claim 1;

ii) imagewise exposing said imaging layer to energy emitting an infrared laser beam of sufficient energy to at least partially decompose the diazo compounds present in said esterification products; and iii) contacting said imaging layer with a developer material wherein the exposed areas of said imaging layer are selectively removed from said support.

* * * * *